(12) United States Patent
Dahlstrom et al.

(10) Patent No.: US 12,382,684 B2
(45) Date of Patent: Aug. 5, 2025

(54) DEVICE HAVING MULTIPLE EMITTER LAYERS

(71) Applicant: TEXAS INSTRUMENTS INCORPORATED, Dallas, TX (US)

(72) Inventors: Mattias Dahlstrom, Los Altos, CA (US); Thomas James Moutinho, Gorham, ME (US); Craig Printy, Buxton, ME (US); Wibo Van Noort, Scarborough, ME (US); Tatsuya Tominari, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/479,638

(22) Filed: Sep. 20, 2021

(65) Prior Publication Data

US 2022/0093736 A1  Mar. 24, 2022

Related U.S. Application Data

(60) Provisional application No. 63/080,872, filed on Sep. 21, 2020.

(51) Int. Cl.
*H10D 62/13* (2025.01)
*H10D 10/01* (2025.01)
*H10D 10/40* (2025.01)

(52) U.S. Cl.
CPC ........... *H10D 62/133* (2025.01); *H10D 10/01* (2025.01); *H10D 10/40* (2025.01)

(58) Field of Classification Search
CPC ............. H01L 29/732; H01L 29/41708; H01L 29/456; H01L 29/66272; H01L 29/0804–0826; H01L 27/0647–067; H01L 29/66234–66348; H01L 29/73–749; H01L 21/28556–28562; H01L 21/0262; H10D 64/62; H10D 62/133; H10D 10/01; H10D 10/40; H10D 10/051; H10D 62/83; H10D 64/231; H10D 10/00–891; H10D 84/641–643; H10D 84/0107–0109; H10D 62/60–605

See application file for complete search history.

(56) References Cited

U.S. PATENT DOCUMENTS

| | | |
|---|---|---|
| 5,075,241 A | 12/1991 | Spratt et al. |
| 5,434,091 A | 7/1995 | Hill et al. |
| 5,892,264 A | 4/1999 | Davis et al. |
| 6,030,864 A | 2/2000 | Appel et al. |
| 6,686,250 B1 | 2/2004 | Kalnitsky et al. |

(Continued)

FOREIGN PATENT DOCUMENTS

CN 102592998 A * 7/2012 ....... H01L 29/66242

*Primary Examiner* — Shahed Ahmed
(74) *Attorney, Agent, or Firm* — Yudong Kim; Frank D. Cimino

(57) ABSTRACT

A semiconductor device include a first semiconductor layer with a first doping concentration. A second semiconductor layer has a second doping concentration and has a first surface and a second opposing surface. The second doping concentration is higher than the first doping concentration. The first surface of the second semiconductor layer is in contact with the first semiconductor layer. A contact is on the second surface of the second semiconductor layer. The contact includes a metal and a semiconductor.

24 Claims, 12 Drawing Sheets

(56) References Cited

U.S. PATENT DOCUMENTS

| | | | |
|---|---|---|---|
| 7,087,979 B1* | 8/2006 | Naem | H01L 29/7378 |
| | | | 257/571 |
| 2004/0124444 A1 | 7/2004 | Kalburge et al. | |
| 2007/0023783 A1* | 2/2007 | Hase | H01L 29/0821 |
| | | | 257/E29.189 |
| 2011/0095398 A1* | 4/2011 | Nonaka | H01L 29/66272 |
| | | | 257/E21.608 |
| 2012/0146086 A1* | 6/2012 | Yokobayashi | H01L 33/14 |
| | | | 257/E33.062 |
| 2019/0103396 A1* | 4/2019 | Zhan | H01L 29/0821 |
| 2019/0206994 A1* | 7/2019 | Huang | H01L 29/6631 |

* cited by examiner

DEVICE HAVING MULTIPLE EMITTER LAYERS

CROSS-REFERENCE TO RELATED APPLICATIONS

This application claims priority to U.S. Provisional Application No. 63/080,872, filed Sep. 21, 2020, which is hereby incorporated by reference.

BACKGROUND

Transistor devices, such as bipolar junction transistors or field effect transistors, have a broad range of applications. The applications of transistor devices include, for example, their use in amplifiers and as switches. Transistors have parasitic characteristics such as parasitic capacitances and parasitic resistances, which can impact device performance.

SUMMARY

In some examples, a semiconductor device includes a first semiconductor layer with a first doping concentration. A second semiconductor layer has a second doping concentration and has a first surface and a second opposing surface. The second doping concentration is higher than the first doping concentration. The first surface of the second semiconductor layer is in contact with the first semiconductor layer. A contact is over the second surface of the second semiconductor layer. The contact includes a metal and a semiconductor.

In some examples, a semiconductor device includes a first emitter layer with a first doping concentration of a first doping type. A second emitter layer has a second doping concentration of the first doping type and has a first surface and a second opposing surface. The second doping concentration is higher than the first doping concentration. The first surface of the second emitter structure is in contact with the first emitter layer. A contact is over the second surface of the second emitter layer. The contact includes a silicide.

In another example, a method of forming a semiconductor device includes forming a first semiconductor layer with a first doping concentration of a first doping type. A second semiconductor layer with a second doping concentration of the first doping type and having a first surface and a second opposing surface is formed. The second doping concentration is higher than the first doping concentration. The first surface of the second semiconductor layer is in contact with the first semiconductor layer. A metal layer is formed over the second semiconductor layer. A contact between the second semiconductor layer and the metal layer is formed by applying a heat treatment.

BRIEF DESCRIPTION OF THE DRAWINGS

For a detailed description of various examples, reference will now be made to the accompanying drawings in which.

DETAILED DESCRIPTION

Figure 1:
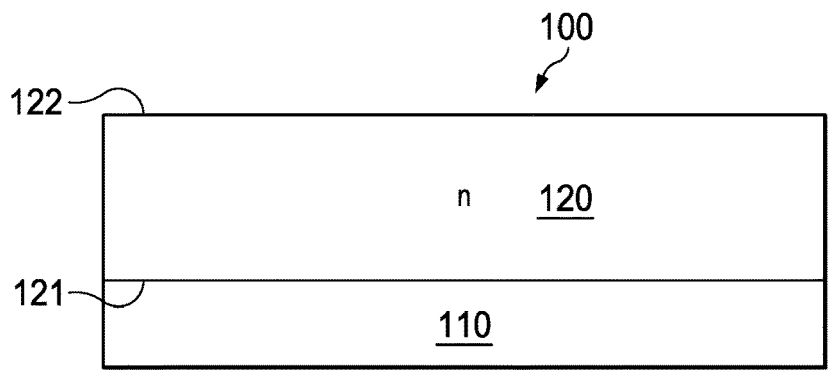
FIGS. 1 to 7 illustrate cross-sectional views of structures at various stages of the formation of a semiconductor device according to described examples.

An emitter resistance of a bipolar junction transistor (BJT) device is a dominant parasitic within the device and scales as the inverse of emitter area. When emitter areas are reduced to sub-micron scale, emitter resistance is substantially increased, leading to degraded performance of the device. Emitter resistance limits the amount of BJT scaling that can be achieved. A factor of 2 reduction in emitter size corresponds to a factor of 4 increase in specific emitter resistance. The majority of the emitter resistance is set by interface resistivity of the interface between the emitter semiconductor and a respective contact, such as a silicide contact. A clean silicide interface resistivity is affected by the doping level. However, a high emitter doping with a narrow emitter-base junction increases the risk of doping the base with emitter dopants, thereby potentially causing an emitter-collector short.

The present disclosure is directed to semiconductor devices having a contact and multiple semiconductor layers with different doping concentrations. Such semiconductor devices may have reduced interface resistance of the interface between the contact and the multiple semiconductor layers, and have improved frequency performance. While such embodiments may be expected to provide improvements relative to conventional devices, no particular result is a requirement of the present invention unless explicitly recited in a particular claim.

Disclosed examples include a semiconductor device, such as a bipolar junction transistor, and a method of forming the semiconductor device. The semiconductor device includes a first semiconductor layer with a first doping concentration, and a second semiconductor layer with a second doping concentration and having a first surface and a second opposing surface. The second doping concentration is higher than the first doping concentration. The semiconductor device further includes a contact over the second surface of the second semiconductor layer, the contact includes a metal (e.g., a metal element or species) and a semiconductor (e.g., a semiconductor element or species). For example, the contact includes silicide formed by metal and silicon. The higher second doping concentration can reduce the resistance of the interface of the second semiconductor layer (e.g., a second emitter layer) and the contact (e.g., the silicide contact), and accordingly, can reduce parasitic resistance and improve device performance. Specifically, when applied to the emitter resistance of a BJT, the reduced emitter resistance results in reduced potential drop in the emitter by emitter current ($I_E$)*emitter resistance ($R_E$), providing higher transconductance and improved signal headroom and linearity. The emitter resistance is also a key parasitic for the millimeter wave performance at frequencies in the 2-200 Ghz range by its impact on frequency ($f_T$) through $R_E(C_{be}+C_{cb})$, where $C_{be}$ is capacitance between base and emitter, and $C_{cb}$ is capacitance between collector and base; and the reduced emitter resistance leads to reduced $R_E(C_{be}+C_{cb})$, and the reduced $R_E(C_{be}+C_{cb})$ leads to increased transit time cut-off frequency ($f_T$).

Reference is made herein to doping types. A doping type may be p-type or n-type. For n-type doping, the dopants may include, for example, at least one of arsenic or phosphorus, or any other suitable dopant species. For p-type doping, the dopants may include, for example, boron or any other suitable dopant species.

Figure 6:
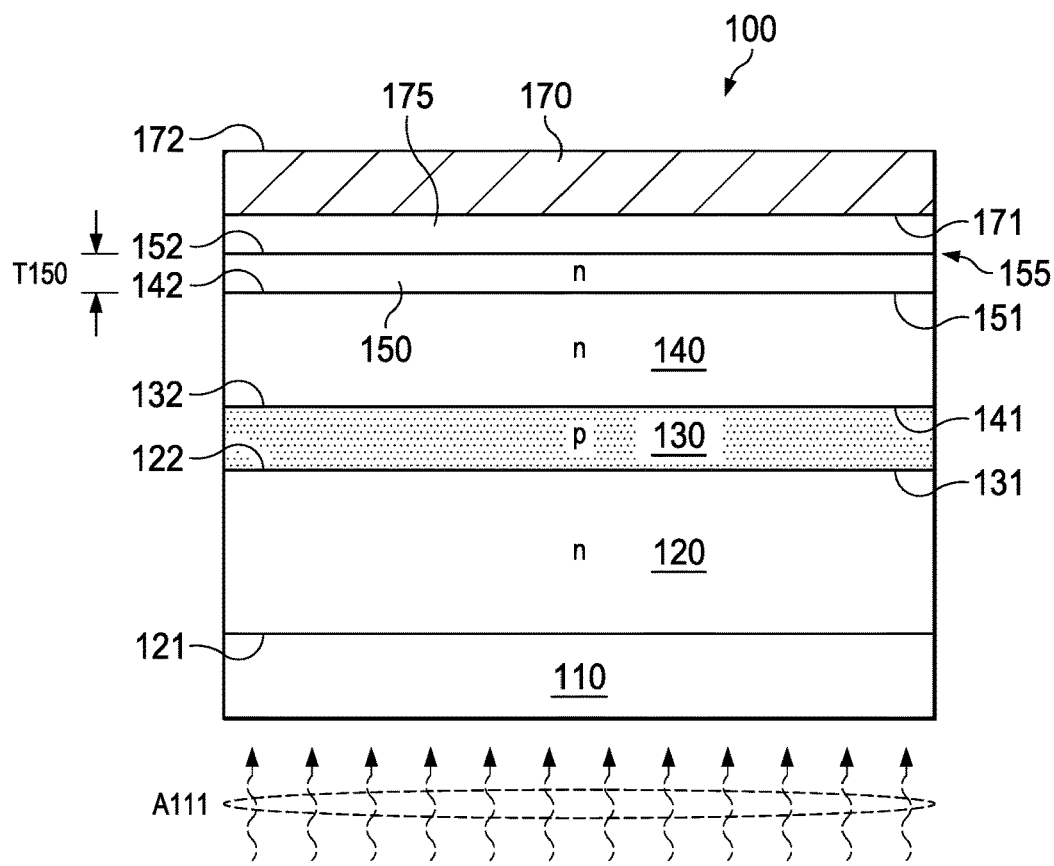
Figure 7:
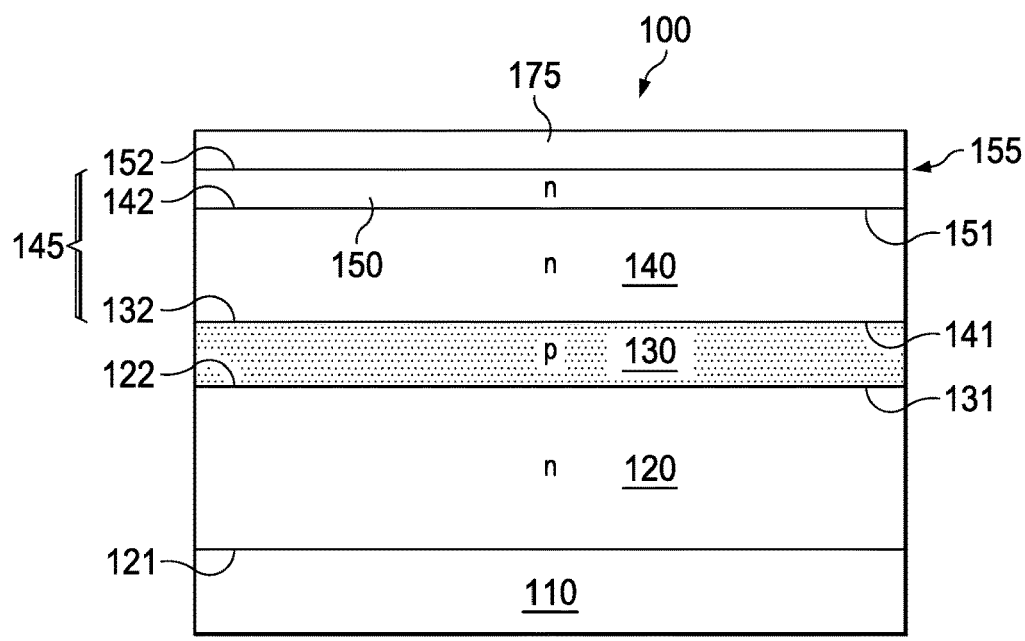
Figure 8:
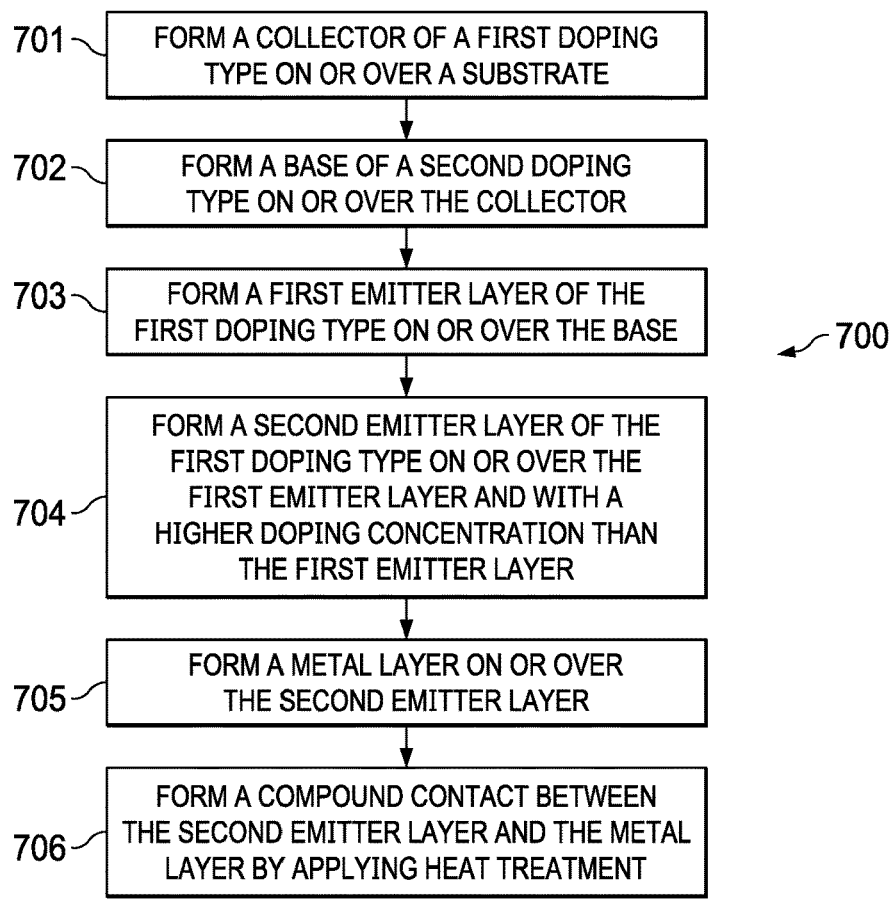
FIG. 8 illustrates a flow chart of an example method for forming a semiconductor device according to described examples.

FIGS. 1 to 7 illustrate cross-sectional views of structures at various stages of the formation of an example semiconductor device 100, and FIG. 8 illustrates a corresponding flow chart of an example method 700 for forming the semiconductor device 100. FIGS. 1-7 will now be described along with references to the flow chart of FIG. 8.

FIG. 1 illustrates a collector 120 (e.g., a collector layer or a collector structure) on or over a substrate 110. The collector 120 has a first surface 121 and a second opposing surface 122. The collector 120 has a first doping type. FIG. 8 illustrates this step as forming a collector of a first doping type on or over a substrate in step 701. The collector 120 may be formed by vapor deposition, such as chemical vapor deposition or physical vapor deposition of a semiconductor material with dopants, or any other suitable method. In some examples, the first doping type of the collector 120 is n-type, and the dopant includes at least one of arsenic or phosphorus or any other suitable dopant species. In other examples, the first doping type of the collector 120 is p-type, and the dopant includes boron, or any other suitable dopant species.

Figure 2:
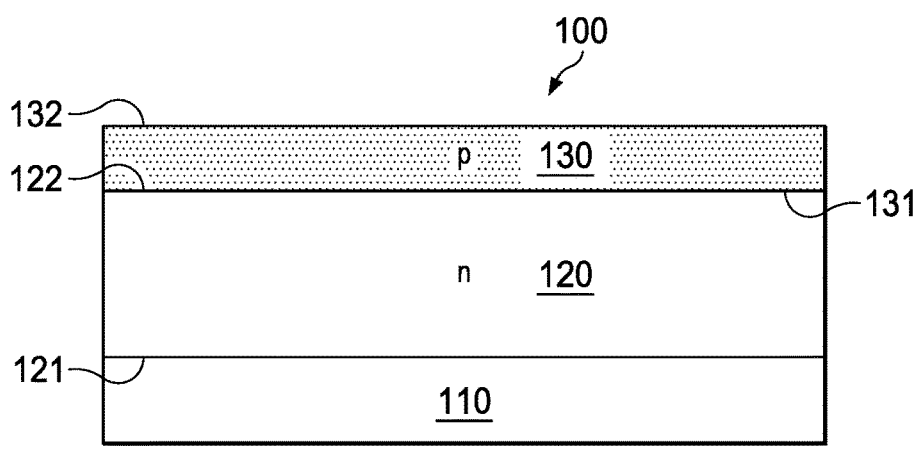

FIG. 2 illustrates a base 130 (e.g., a base layer or a base structure) on or over the collector 120. The base 130 has a first surface 131 and a second opposing surface 132. The base 130 is a semiconductor of a second doping type. The first surface 131 of the base 130 is in contact with the second surface 122 of the collector 120. FIG. 8 illustrates this step as forming a base of a second doping type on or over the collector in step 702. The base 130 may be formed by vapor deposition, such as chemical vapor deposition or physical vapor deposition of a semiconductor material and dopants, or any other suitable method.

The second doping type of the base 130 is opposite the first doping type of the collector 120. In some examples, the first doping type is n-type, and the second doping type is p-type. In other examples, the first doping type is p-type, and the second doping type is n-type.

Figure 3:
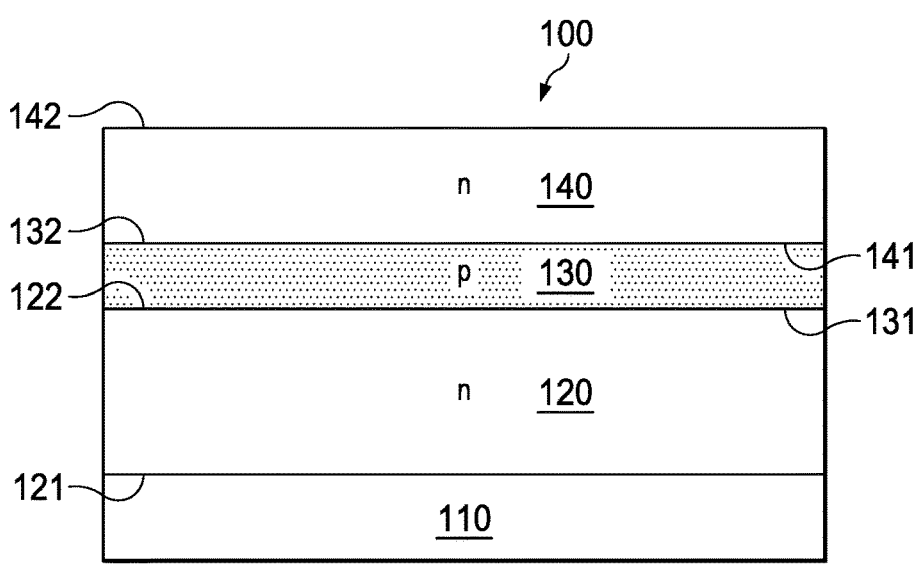

FIG. 3 illustrates a first emitter layer 140 on or over a surface of the base 130 opposite the collector 120. The first emitter layer 140 has a first surface 141 and a second opposing surface 142. The first surface 141 of the first emitter layer 140 is in contact with the second surface 132 of the base 130. FIG. 8 illustrates this step as forming a first emitter layer of the first doping type on or over the base in step 703. The first emitter layer 140 is a semiconductor layer. The first emitter layer 140 may be formed by vapor deposition, such as chemical vapor deposition or physical vapor deposition of a semiconductor material and dopants, or by any other suitable method. The semiconductor material may include at least one of silicon or germanium. In some examples, the vapor deposition for forming the first emitter layer 140 has a first dopant flow rate and a first growth temperature.

Figure 4:
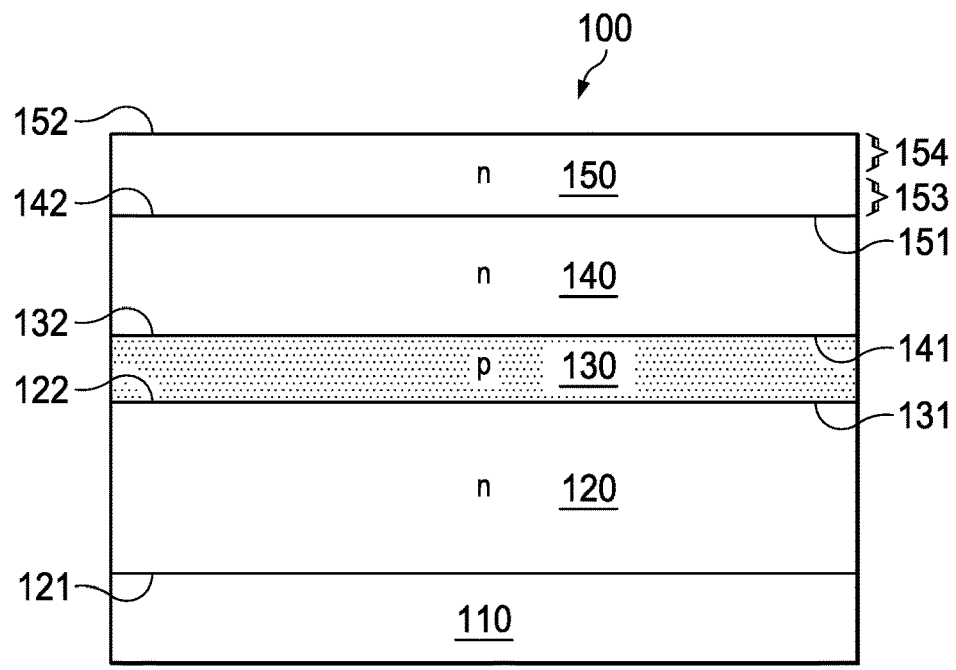

FIG. 4 illustrates a second emitter layer 150 on a surface of the first emitter layer 140 opposite the base 130. The second emitter layer 150 has a first surface 151 and a second opposing surface 152. The first surface 151 of the second emitter layer 150 is in contact with the second surface 142 of the first emitter layer 140. The second emitter layer 150 has a higher doping concentration than the first emitter layer 140. FIG. 8 illustrates this step as forming a second emitter layer of the first doping type on or over the first emitter layer and with a higher doping concentration than the first emitter layer in step 704. The second emitter layer 150 is a semiconductor layer. The second emitter layer 150 may be formed by vapor deposition, such as chemical vapor deposition or physical vapor deposition of a semiconductor material with dopants, or any other suitable method. The semiconductor material may include at least one of silicon or germanium. The second emitter layer 150 includes a first portion 153 and a second portion 154 on or over the first portion 153. In the example of FIG. 4, the second surface 152 has a flat topography. In some examples, the first emitter layer 140 and the second emitter layer 150 are n-type, and their dopants include at least one of arsenic or phosphorus, or any other suitable dopant species. In other examples, the first emitter layer 140 and the second emitter layer 150 are p-type, and their dopant include boron or any other suitable dopant species.

The vapor deposition for forming the second emitter layer 150 has a second dopant flow rate and a second growth temperature. In some examples, the second dopant flow rate for forming the second emitter layer 150 is higher than the first dopant flow rate for forming the first emitter layer 140, such that a second doping concentration of the second emitter layer 150 is higher than a first doping concentration of the first emitter layer 140. In certain examples, the second growth temperature for forming the second emitter layer 150 may be lower than the first growth temperature for forming the first emitter layer 140, such that the second doping concentration of the second emitter layer 150 is (or is further) increased as compared to the first doping concentration of the first emitter layer 140.

In some examples, the second dopant flow rate for forming the second emitter layer 150 has a value in a range of 100 to 250 standard cubic centimeters per minute (sccm). In certain example, the second dopant flow rate for forming the second emitter layer 150 has a value of 160 sccm. For example, $AsH_3$ is used for providing As dopants, and the second dopant flow rate of $AsH_3$ for forming the second emitter layer 150 has a value in a range of 100 to 250 sccm. The second dopant flow rate for forming the second emitter layer 150 may be chosen according to various factors, such as deposition methods, dopant species, etc. In certain examples, the second growth temperature for forming the second emitter layer 150 has a value in a range of 500 to 700 degrees Celsius. In some examples, the second doping concentration of the second emitter layer 150 includes a value in a range of $1\times10^{19}$ to $5\times10^{21}$ $cm^{-3}$. In certain examples, the second doping concentration of the second emitter layer 150 includes a value in a range of $1\times10^{20}$ to $1\times10^{21}$ $cm^{-3}$. In another example, the second doping concentration of the second emitter layer 150 includes a value that is above $5\times10^{21}$ $cm^{-3}$. The second doping concentration of the second emitter layer 150 may be chosen according to various factors such as doping incorporation, activation, and excessive diffusion.

In certain examples, with the second doping concentration of the second emitter layer 150, the number of dopant atoms (or dopants) in the second emitter layer 150 has a value greater than an activation limit of the second emitter layer 150 for the respective dopants. In some examples, when forming the second emitter layer 150, the number of dopant atoms (or dopants) being introduced to the second emitter layer 150 can be higher than a solubility limit of the second emitter layer 150 for the respective dopants, and the excess dopant atoms (or dopants) with respect to the solubility limit of the second emitter layer 150 can move into the first emitter layer 140. A doping concentration of a semiconductor layer (such as the second emitter layer 150) refers to the total doping concentration of the semiconductor layer that is the sum of active dopants positioned in substitutional lattice positions, and inactive dopants present at interstitials. An active doping concentration of a semiconductor layer (such as the second emitter layer 150) is the concentration of electrically active dopants at substitutional atomic lattice positions. An active doping concentration of a semiconductor layer counts only electrically active dopant atoms (or electrically active dopants) and does not count inactive dopant atoms (or inactive dopants), while the total doping concentration counts the active dopant atoms (or active dopants) and inactive dopant atoms (or inactive dopants) if these dopant atoms (or these dopants) exist in the semiconductor layer.

An activation limit of a semiconductor layer (such as the second emitter layer 150) is the number of doping atoms that can be incorporated into a substitutional lattice position and is different from solubility limit which is the number of doping atoms that can be incorporated regardless of whether they are active on a lattice position. With the increased second doping concentration of the second emitter layer 150, the number of dopants (e.g., dopant atoms) in the second emitter layer 150 may include or have a value greater than the activation limit of the second emitter layer 150, and interface resistance between the second emitter layer and a respective contact can be reduced. Accordingly, the emitter resistance can be reduced, and device performance (such as frequency performance) can be improved. In certain examples, the incorporated but inactive dopant atoms in the second emitter layer 150 can provide an improved emitter resistance by trap assisted tunneling.

The doping incorporation (or doping concentration) can be increased by reduced growth rate, increased dopant flow, switching to binary or ternary dopant gases, or by reducing the growth temperature. The total doping incorporation (or total doping concentration) can be determined by Secondary Ion Mass Spectroscopy (SIMS) and the activation can be determined by Hall or resistivity measurements.

In some examples, the first dopant flow rate for forming the first emitter layer 140 has a value in a range of 25 to 100 sccm. In certain examples, the first dopant flow rate for forming the first emitter layer 140 has a value of 50 sccm. In another example, the first growth temperature for forming the first emitter layer 140 has a value in a range of 600 to 800 degrees Celsius. In some examples, the first doping concentration of the first emitter layer 140 includes a value in a range of $5 \times 10^{18}$ to $2 \times 10^{20}$ cm$^{-3}$.

In some examples, the second growth temperature for forming the second emitter layer 150 is reduced as compared to the first growth temperature for forming the first emitter layer 140. With the reduced second growth temperature, dopant activation ratio (such as arsenic activation ratio) may be reduced in the second emitter layer 150, but the second doping concentration (such as arsenic concentration) can be increased sufficiently in the second emitter layer 150 to increase the active doping concentration. The dopant activation ratio is the ratio of the number of the electrically active dopants (e.g., electrically active dopant atoms) on a substitutional lattice position to the number of total dopants (e.g., total dopant atoms). With the increased second doping concentration of the second emitter layer 150, interface resistance between the second emitter layer and a respective contact can be reduced. Accordingly, the emitter resistance can be reduced, and device performance (such as frequency performance) can be improved.

In some examples, the doping concentrations in semiconductor layers, such as the first emitter layer 140 and the second emitter layer 150, are detected by SIMS.

In certain examples, the second emitter layer 150 is formed by depositing silicon with a dopant (or dopant species) and with at least one of germanium or carbon. At least one of germanium or carbon may be added during deposition, so as to increase doping concentration of the dopant in the second emitter layer.

The doping concentration of the second emitter layer 150 may be increased, as compared to the doping concentration of the first emitter layer 140, by reducing the second growth temperature (as compared to the first growth temperature), by increasing the second dopant flow rate (as compared to the first dopant flow rate), and/or by depositing silicon with a dopant (or dopant species) and with at least one of germanium or carbon, when forming the second emitter layer 150. In one example, the second dopant flow rate for forming the second emitter layer 150 and the first dopant flow rate for forming the first emitter layer 140 are the same and have a same value in a range of 100 to 250 sccm, the first growth temperature for forming the first emitter layer 140 has a value of 680 degrees Celsius, and the second growth temperature for forming the second emitter layer 150 has a value of 630 degrees Celsius that is reduced as compared to the first growth temperature, and accordingly, the doping concentration of the second emitter layer 150 can be increased as compared to the doping concentration of the first emitter layer 140. In another example, the first growth temperature for forming the first emitter layer 140 and the second growth temperature for forming the second emitter layer 150 are the same and have a same value of 630 degrees Celsius, the first dopant flow rate for forming the first emitter layer 140 has a value in a range of 25 to 100 sccm, and the second dopant flow rate for forming the second emitter layer 150 has a value in a range of 100 to 250 that is higher than the first dopant flow rate, and accordingly, the doping concentration of the second emitter layer 150 can be increased as compared to the doping concentration of the first emitter layer 140.

Figure 5:
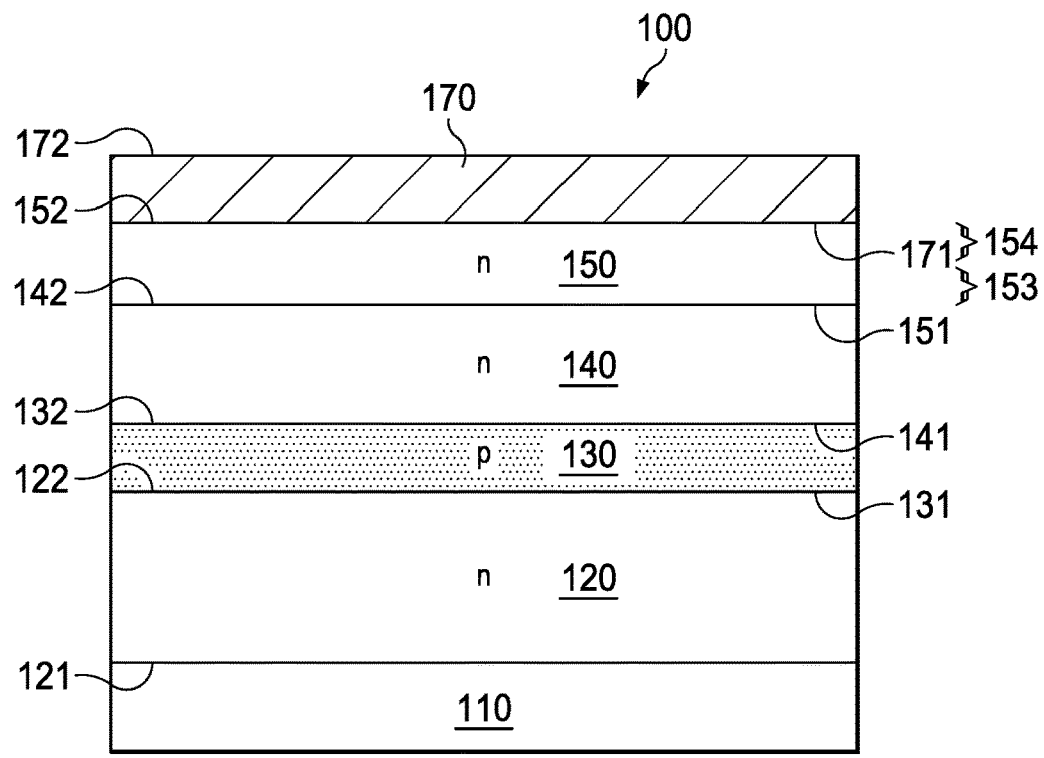

FIG. 5 illustrates a metal layer 170 on the second emitter layer 150. The metal layer 170 has a first surface 171 and a second opposing surface 172. The first surface 171 of the metal layer 170 is in contact with the second surface 152 of the second emitter layer 150. FIG. 8 illustrates this step as forming a metal layer on or over the second emitter layer in step 705. The metal layer 170 may be formed by deposition, such as chemical vapor deposition or physical vapor deposition of metal. The metal layer 170 is in contact with the second portion 154 of the second emitter layer 150. In some examples, the metal layer 170 includes at least one of nickel, platinum, cobalt or titanium.

FIG. 6 illustrates a compound contact 175 between the second emitter layer 150 and the metal layer 170 formed by a heat treatment A111. FIG. 8 illustrates this step as forming a compound contact between the second emitter layer and the metal layer by applying heat treatment in step 706.

In some examples, the heat treatment A111 includes heating or annealing the second emitter layer 150 and the metal layer 170 at a temperature in a range of 300 to 700 degrees Celsius. During the heat treatment, metal in the metal layer 170 can diffuse or move to the second portion 154 of the second emitter layer 150 (see, e.g., FIG. 5) to combine with materials therein, and convert the second portion 154 of the second emitter layer 150 into a compound contact 175 that includes metal and semiconductor such as silicon (see, e.g., FIG. 6).

Accordingly, the second surface 152 of the second emitter layer 150 shifts or moves towards the first surface 151 of the second emitter layer 150, and the thickness T150 of the second emitter layer 150 is reduced in FIG. 6 as compared to FIG. 5. Further, as the compound contact 175 is formed, the second surface 152 of the second emitter layer 150 is in contact with the compound contact 175, and the compound contact 175 and the second emitter layer 150 have an interface 155 at a boundary of the compound contact 175 and the second emitter layer 150. The compound contact 175 may include a compound formed by a semiconductor element and a metal element.

In some examples, the metal layer 170 includes cobalt; and the second emitter layer 150 includes silicon and dopants. During the heat treatment, cobalt in the metal layer can diffuse or move to the second portion 154 of the second emitter layer 150 (see, e.g., FIG. 5) to combine with silicon therein to form silicide, and accordingly convert the second portion 154 of the second emitter layer 150 into a compound contact 175 that includes silicide (see, e.g., FIG. 6).

After the compound contact 175 is formed, the metal layer 170 may be removed by, e.g., etching. FIG. 7 illustrates an example semiconductor device 100. The semiconductor device 100 includes the collector 120 on or over the substrate 110, the base 130 on or over the collector 120, the first emitter layer 140 on or over the base 130, the second emitter layer 150 on or over the first emitter layer 140, and a compound contact 175 on or over the second emitter layer 150. The compound contact 175 and the second emitter layer 150 have an interface 155 at the boundary of the compound contact 175 and the second emitter layer 150. In some examples, a metallic connection such as a tungsten contact (not shown in FIG. 7) may be formed over the compound contact 175 by, e.g., vapor deposition. The metallic connection connects the emitter to other components (not shown in FIG. 7) of the device. The first emitter layer 140 and the second emitter layer 150 forms an emitter 145 that includes two emitter layers with different doping concentrations. In certain examples, the contact includes at least one of silicide or germanide. In some examples, the contact includes silicide, and silicide includes silicon and at least one of nickel, platinum, cobalt or titanium.

In some examples, the first emitter layer 140 includes monocrystalline or polycrystalline semiconductor, such as monocrystalline or polycrystalline silicon. In certain examples, the second emitter layer 150 includes monocrystalline or polycrystalline semiconductor, such as monocrystalline or polycrystalline silicon.

The second doping concentration of the second emitter layer 150 is higher than the first doping concentration of the first emitter layer 140. The higher second doping concentration of the second emitter layer 150 can reduce the resistance of the interface 155 of the second emitter layer 150 and the compound contact 175. Accordingly, an emitter resistance of the semiconductor device 100 can be reduced.

Further, the risk of over running the base 130 by the dopants of the second emitter layer 150 can be reduced, as the first emitter layer 140 with the lower first doping concentration is between the base 130 and the second emitter layer 150. Therefore, the risk of an emitter-collector short in the semiconductor device 100 can be reduced. In some examples, the first doping concentration of the first doping type of the first emitter layer 140 is lower than a doping concentration of the second doping type of the base 130.

In some examples, the first doping type is n-type, and the second doping type is p-type, and the collector 120, the first emitter layer 140, and the second emitter layer 150 are n-type, and the base 130 is p-type; and accordingly, the semiconductor device 100 is an n-p-n bipolar junction transistor device. In other examples, the first doping type is p-type, and the second doping type is n-type, and the collector 120, the first emitter layer 140, and second emitter layer 150 are p-type, and the base 130 is n-type; and accordingly, the semiconductor device 100 is a p-n-p bipolar junction transistor device.

Figure 12:
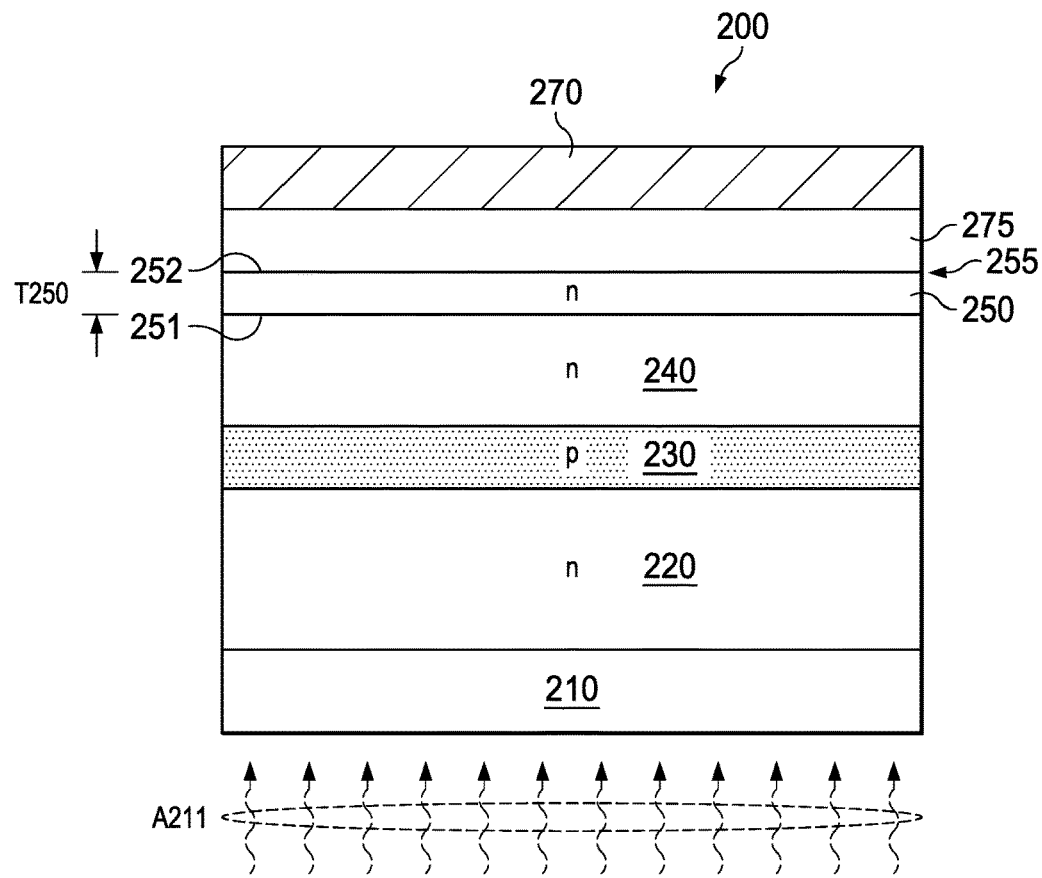
Figure 13:
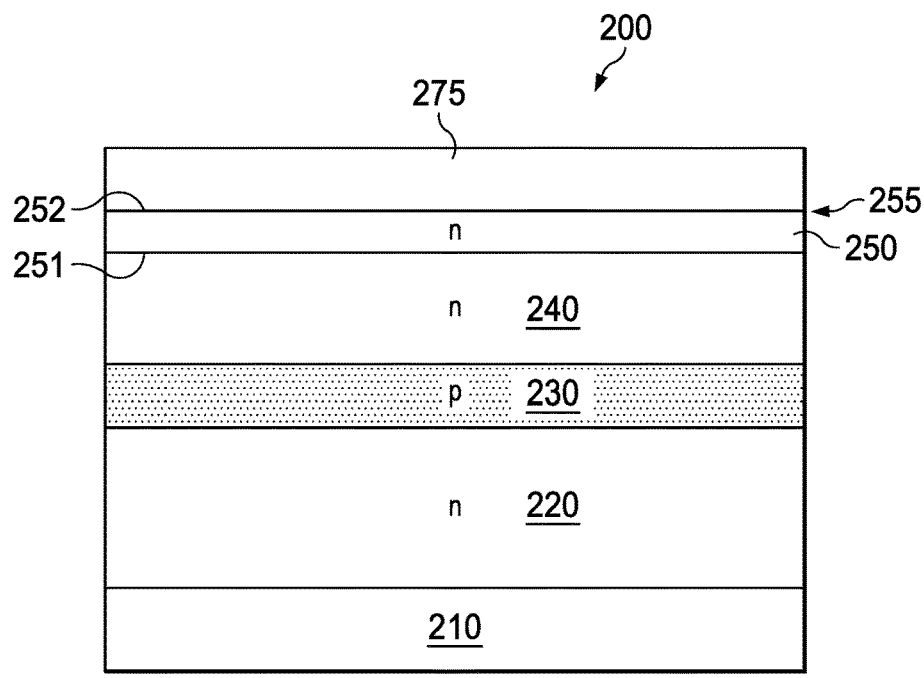
Figure 14:
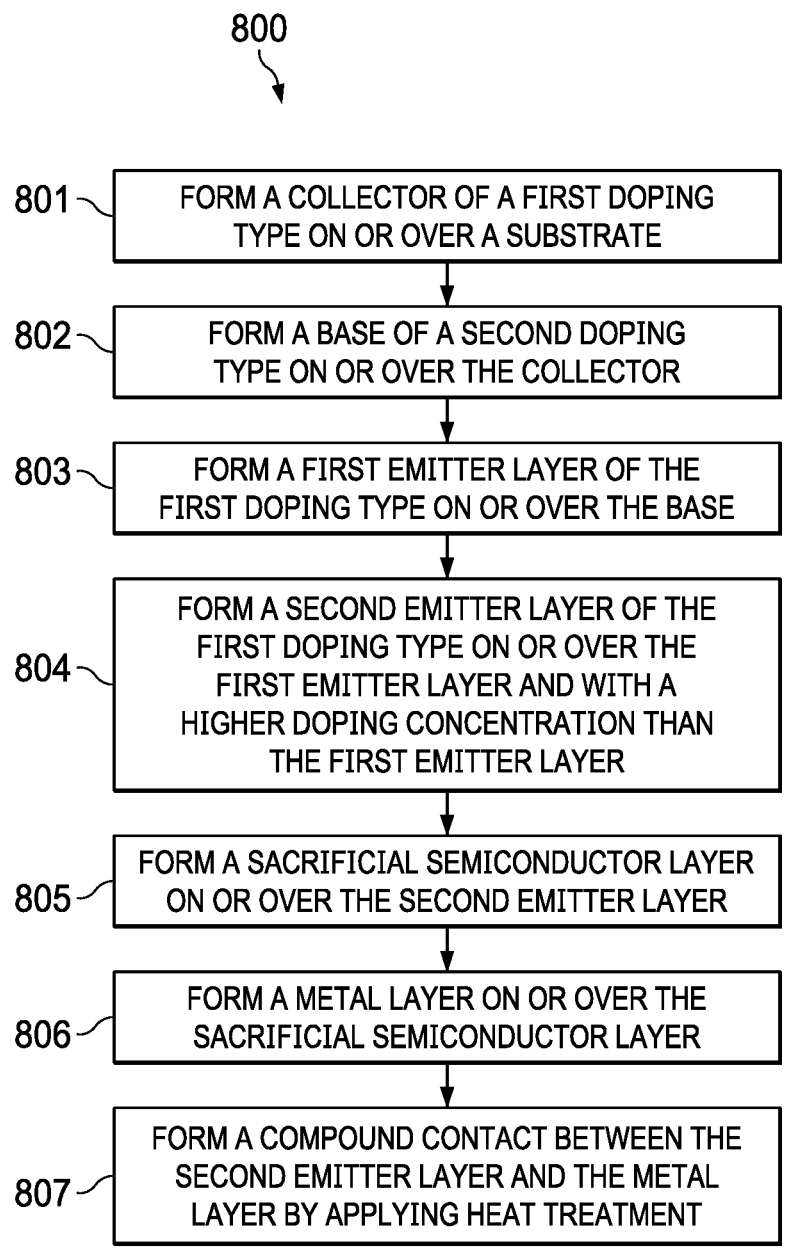
FIG. 14 illustrates a flow chart of another example method for forming a semiconductor device according to described examples.

FIGS. 9 to 13 illustrate cross-sectional views of structures at various stages of formation of another example semiconductor device 200, and FIG. 14 illustrates a corresponding flow chart of another example method 800 for forming the semiconductor device 200. FIGS. 9 to 13 will now be described along with references to the flow chart of FIG. 14.

Figure 9:
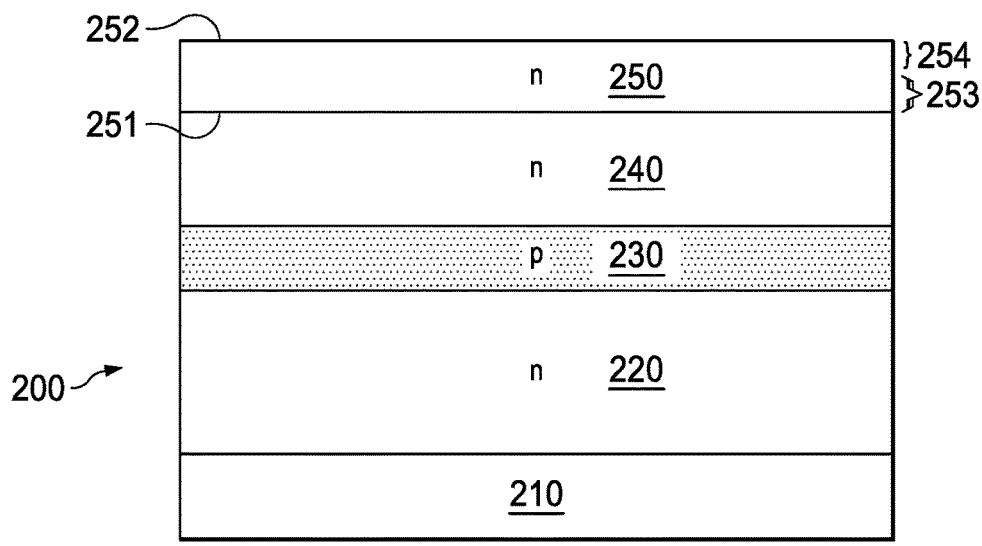
FIGS. 9 to 13 illustrate cross-sectional views of structures at various stages of the formation of another semiconductor device according to described examples.

FIG. 9 illustrates a collector 220 on or over a substrate 210, a base 230 on or over the collector 220, a first emitter layer 240 on or over a surface of the base 230 opposite the collector 220, a second emitter layer 250 on or over a surface of the first emitter layer 240 opposite the base 230. The second emitter layer 250 has a first surface 251 and a second opposing surface 252. The first surface 251 of the second emitter layer 250 is in contact with the first emitter layer 240. The second emitter layer 250 includes a first portion 253 and a second portion 254 on or over the first portion 253. A second doping concentration of the second emitter layer 250 is higher than a first doping concentration of the first emitter layer 240.

The collector 220, the base 230, the first emitter layer 240, the second emitter layer 250 are the same as or similar to the collector 120, the base 130, the first emitter layer 140, and the second emitter layer 150 of the semiconductor device 100. For details of structures 210, 220, 230, 240, and 250, references can be made to the above descriptions, such as descriptions associated with the semiconductor device 100.

Steps 801, 802, 803, and 804 of the method 800 in FIG. 14 illustrates processes of forming structures 210, 220, 230, 240, and 250. Steps 801, 802, 803, and 804 are the same as or similar to steps 701, 702, 703, and 704 of the method 700 in FIG. 8. For details of Steps 801, 802, 803, and 804, references can be made to the above descriptions, such as the descriptions associated with the method 700.

Figure 10:
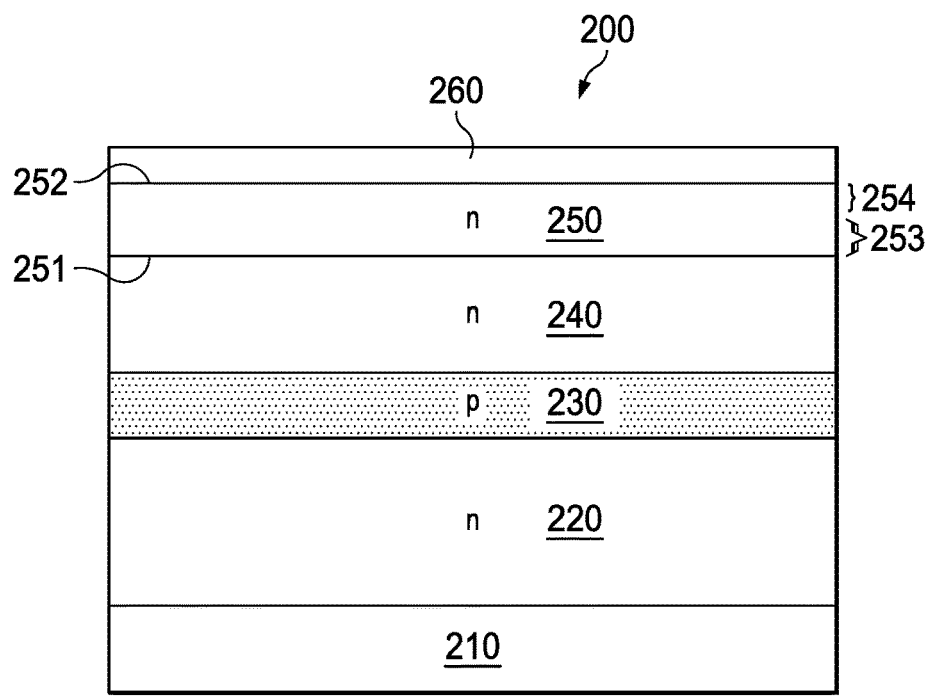

FIG. 10 illustrates a sacrificial semiconductor layer 260 on or over the second emitter layer 250. The sacrificial semiconductor layer 260 (e.g., a cap sacrificial semiconductor layer) is in contact with the surface 252 of the second emitter layer 250. FIG. 14 illustrates this step as forming a sacrificial semiconductor layer on or over the second emitter layer in step 805. The second emitter layer 250 includes a first portion 253 and a second portion 254 on or over the first portion 253. The sacrificial semiconductor layer 260 is in contact with the second surface 252 of the second emitter layer 250. In some examples, the sacrificial semiconductor layer 260 has the same first doping type as the second emitter layer 250, and is doped at a lower doping concentration than the second emitter layer 250. In other examples, the sacrificial semiconductor layer 260 is undoped.

Figure 11:
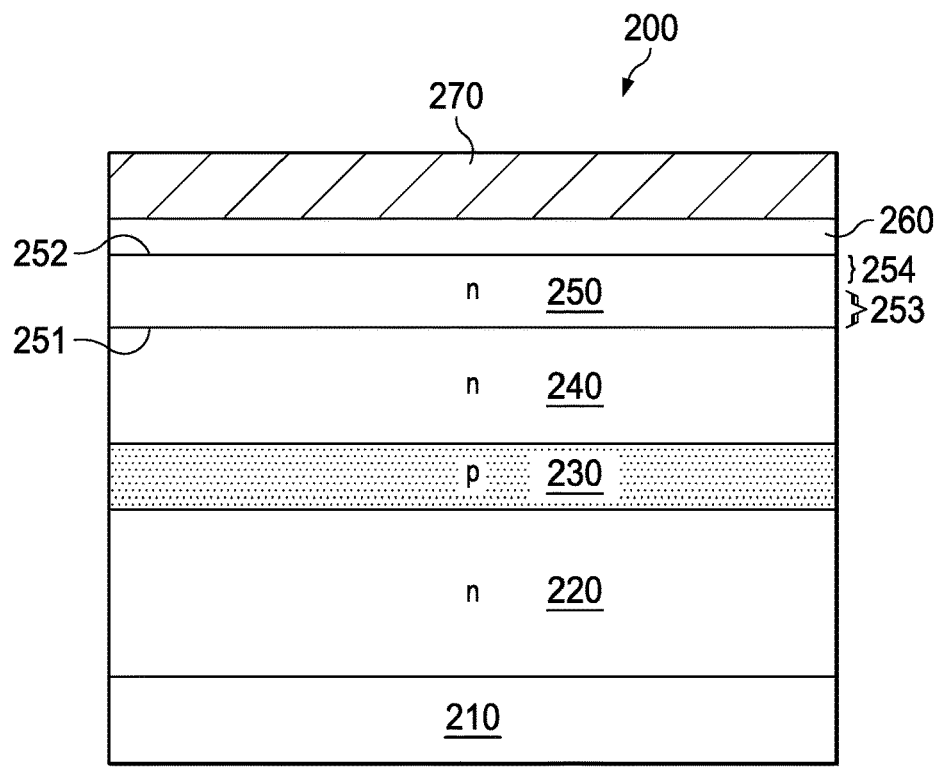

FIG. 11 illustrates a metal layer 270 over the sacrificial semiconductor layer 260. FIG. 14 illustrates this step as forming a metal layer on or over the sacrificial semiconductor layer in step 806. The metal layer 270 may be formed by vapor deposition, such as chemical vapor deposition or physical vapor deposition. In some examples, the metal layer 270 includes at least one of nickel, platinum, cobalt or titanium.

FIG. 12 illustrates a compound contact 275 between the second emitter layer 250 and the metal layer 270 formed by the heat treatment A211. FIG. 14 illustrates this step as forming a compound contact between the second emitter layer and the metal layer by applying heat treatment in step 807.

In some examples, referring to FIGS. 11 and 12, the heat treatment A211 includes heating or annealing the second emitter layer 250, the sacrificial semiconductor layer 260, and the metal layer 270 at a temperature in a range of 300 to 700 degrees Celsius. During the heat treatment, some of metal in the metal layer 270 can diffuse or move to the sacrificial semiconductor layer 260 and can further diffuse or move to the second portion 254 of the second emitter layer 250 to combine with materials therein, and convert the sacrificial semiconductor layer 260 and the second portion 254 of the second emitter layer 250 into a compound contact 275 that includes metal and semiconductor such as silicon (see, e.g., FIG. 12). Accordingly, the second surface 252 of the second emitter layer 250 shifts or moves towards the first surface 251 of the second emitter layer 250, and the thickness T250 of the second emitter layer 250 is reduced in FIG. 12, as compared to FIG. 11. With the heat treatment A211, the sacrificial semiconductor layer 260 is converted into a portion of the compound contact 275.

Further, as the compound contact 275 is formed, the second surface 252 of the second emitter layer 250 is in contact with the compound contact 275, and the compound contact 275 and the second emitter layer 250 have an interface 255 at a boundary of the compound contact 275 and the second emitter layer 250. The use of the sacrificial semiconductor layer 260 can improve smoothness of the interface 255 at the boundary of the compound contact 275 and the second emitter layer 250.

A silicide-silicon interface can be smoother when a doping concentration in the silicon is below a certain threshold value, while the resistance of silicide-silicon interface can be reduced and improved by forming the silicide-silicon interface in a highly doped silicon region. A sacrificial silicon cap layer with a lower doping concentration on a silicon layer (e.g., the second emitter layer) with a higher doping concentration can allow both interface smoothness and interface resistance to be improved.

In some examples, the metal layer 270 includes cobalt; the second emitter layer 250 includes silicon having the second doping concentration; and the sacrificial semiconductor layer 260 includes silicon at a lower doping concentration than the second emitter layer 250. During the heat treatment, cobalt in the metal layer 270 can diffuse or move to the sacrificial semiconductor layer 260 and the second portion 254 of the second emitter layer 250 to combine with silicon therein to form silicide, and accordingly convert the sacrificial semiconductor layer 260 and the second portion 254 of the second emitter layer 250 into a compound contact 275 that includes silicide.

After the compound contact 275 is formed, the metal layer 270 may be removed by, e.g., etching.

FIG. 13 illustrates another example semiconductor device 200. The semiconductor device 200 may be formed using the method 800 of FIG. 14. The semiconductor device 200 includes the collector 220 on or over the substrate 210, the base 230 on or over the collector 220, the first emitter layer 240 on or over the base 230, the second emitter layer 250 on or over the first emitter layer 240, and a compound contact 275 on or over the second emitter layer 250. The compound contact 275 and the second emitter layer 250 have an interface 255 at a boundary of the compound contact 275 and the second emitter layer 250.

A second doping concentration of the second emitter layer 250 is higher than a first doping concentration of the first emitter layer 240. The higher second doping concentration of the second emitter layer 250 can reduce the resistance of the interface 255 of the second emitter layer 250 and the compound contact 275. Accordingly, an emitter resistance of the semiconductor device 200 can be reduced. Further, the risk of over running the base 230 by the dopants of the second emitter layer 250 can be reduced, as the first emitter layer 240 with the lower first doping concentration is between the base 230 and the second emitter layer 250. Therefore, risk of an emitter-collector short in the semiconductor device 200 can be reduced.

Certain structures of the semiconductor device 200 is the same as or similar to structures of the above-described semiconductor device 100. For details of the semiconductor device 200, references can be made to the above descriptions associated with the semiconductor device 100. As the method 800 of forming the semiconductor device 200 includes the use of the sacrificial semiconductor layer 260, the smoothness of the interface 255 of the semiconductor device 200 can be improved, and accordingly the resistance of the interface 255 and emitter resistance of the semiconductor device 200 can be reduced.

Figure 15:
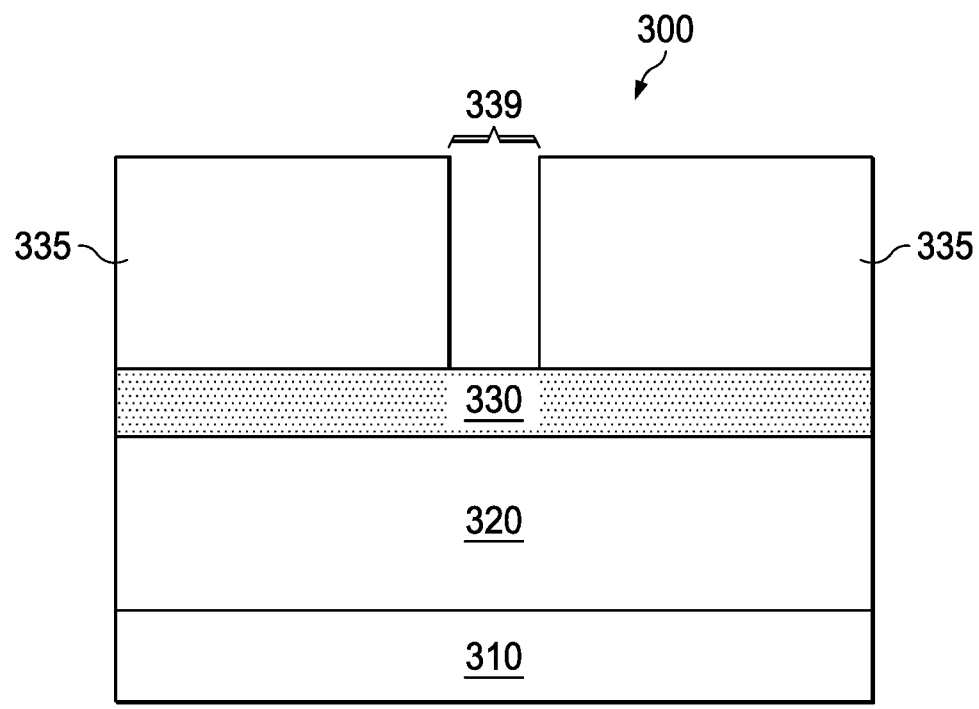
FIGS. 15 to 18 illustrate cross-sectional views of structures at various stages of the formation of another semiconductor device according to described examples.

FIGS. 15 to 18 illustrate cross-sectional views of structures at various stages of formation of another example semiconductor device 300. FIG. 15 illustrates a collector 320 on or over a substrate 310, a base 330 on or over the collector 320, and one or more side walls 335 on or over the base 230, and a region 339 (e.g., a cavity region) on or over the base 330 and surrounded by the side walls 335.

The substrate 310, the collector 320, the base 330, are the same as or similar to the substrate 110, the collector 120, and the base 130 of the semiconductor device 100. The method of forming the substrate 310, the collector 320, and the base 330 is the same as or similar to the method of forming the substrate 110, the collector 120, and the base 130 of the semiconductor device 100. For details of structures 310, 320, 330 and respective method, references can be made to the above descriptions, such as the descriptions associated with the semiconductor device 100 and the method of forming the semiconductor device 100.

The side walls 335 may include at least one of nitride or oxide. In some examples, the side walls 335 is formed by depositing a nitride or oxide film, and etching away a portion of the film to form the region 339 and the side walls 335 surrounding the region 339.

Figure 16:
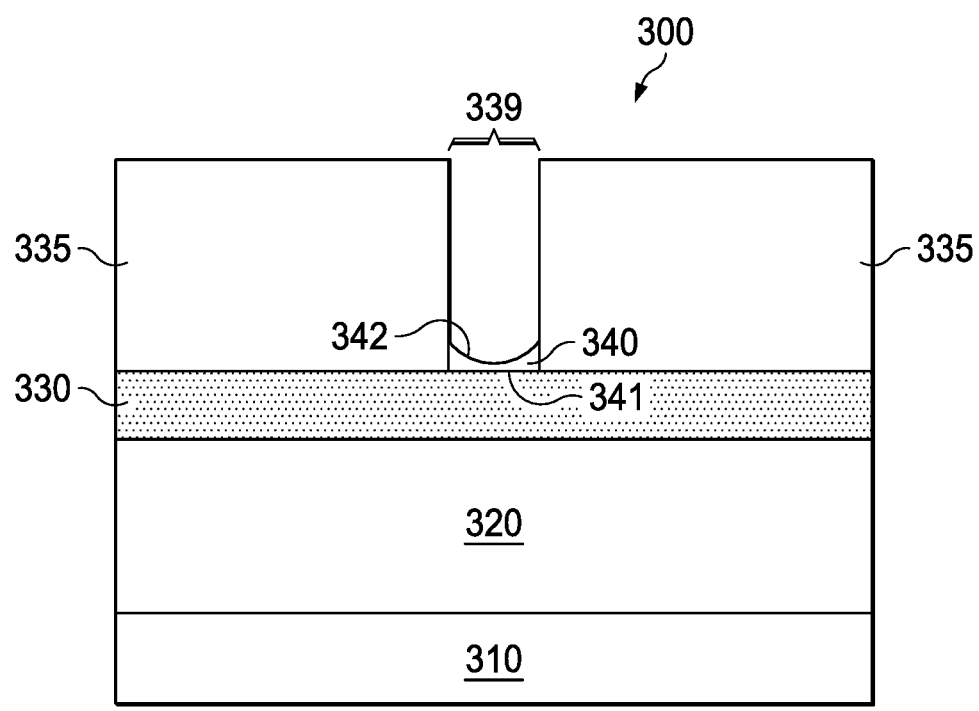

FIG. 16 illustrates a first emitter layer 340 over the base 330 and in the region 339. The first emitter layer 340 has a first surface 341 and a second surface 342. The second surface 342 may have a curved topography. The first surface 341 of the first emitter layer 340 is in contact with the base 330. The first emitter layer 340 may be formed by vapor deposition, such as chemical vapor deposition or physical vapor deposition of a semiconductor material and dopants, or any other suitable method. Due to different growth rates over semiconductor of the base 330 and nitride or oxide of side walls 335, the second surface 342 of the first emitter layer 340 may have a curved topography.

The semiconductor of the collector 320, the base 330, and the first emitter layer 340 may include at least one of silicon or germanium. In some examples, the vapor deposition for forming the first emitter layer 340 has a first dopant flow rate and a first growth temperature.

Figure 17:
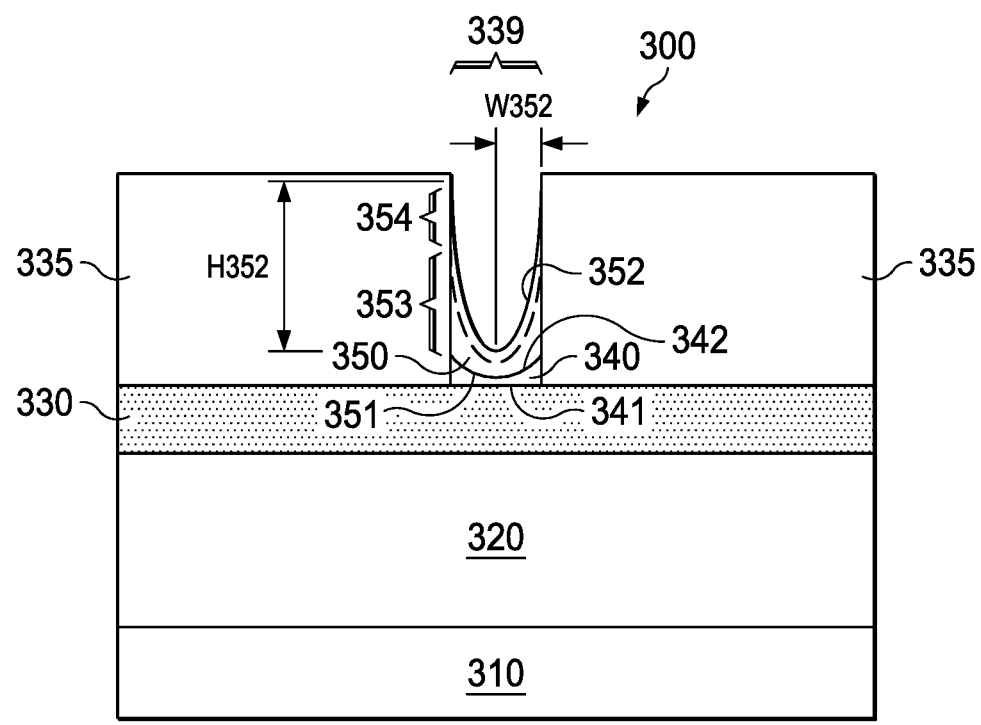

FIG. 17 illustrates a second emitter layer 350 on or over the first emitter layer 340. The second emitter layer 350 has a first surface 351 and a second opposing surface 352. In the example of FIG. 17, the second surface 352 has a curved topography, and the curved topography has a height H352 larger than a width W352 to form a folded topography or folded structure. The first surface 351 of the second emitter layer 350 is in contact with the second surface 342 of the first emitter layer 340. The second emitter layer 350 has a higher doping concentration than the first emitter layer 340. The second emitter layer 350 has the first doping type, and may be formed on or over the first emitter layer 340 and with a higher doping concentration than the first emitter layer 340. The second emitter layer 350 may be formed by vapor deposition, such as chemical vapor deposition or physical vapor deposition of a semiconductor material and dopants, or by any other suitable method. The semiconductor material may include at least one of silicon or germanium. The second emitter layer 350 includes a first portion 353 and a second portion 354 over the first portion 353.

For different growth rates over semiconductor of the first emitter layer 340 and nitride or oxide of side walls 335, the second surface 352 of the second emitter layer 350 may have a curved topography (e.g., a folded topography).

Figure 18:
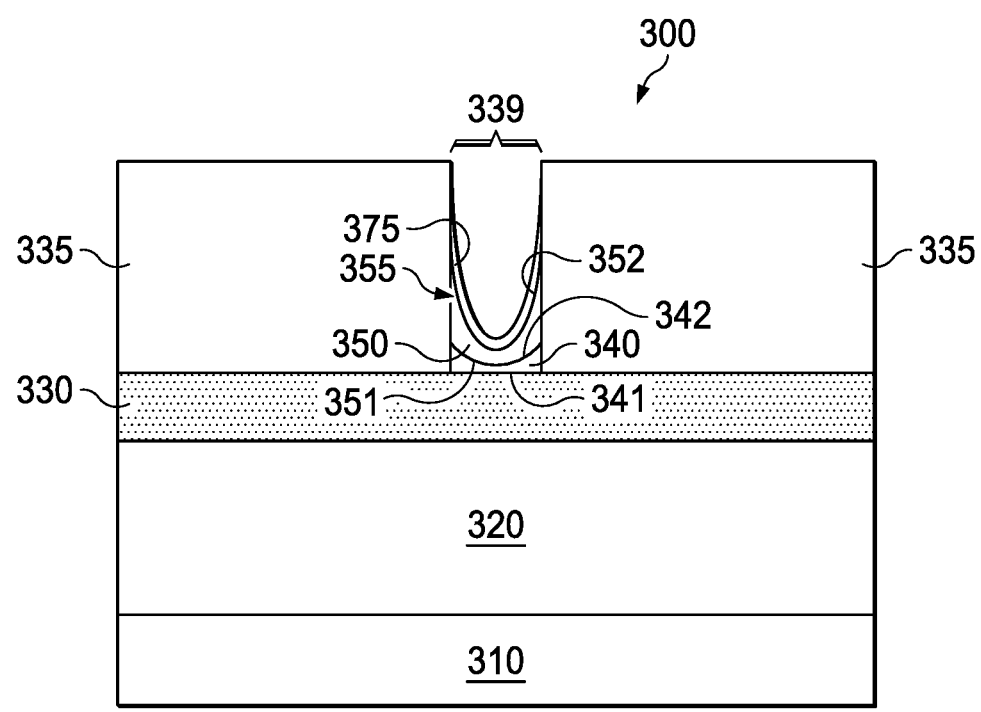

Further, a metal layer may be deposited over the second surface 352 of the second emitter layer 350, a heat treatment may be performed to convert the second portion 352 of the second emitter layer 350 into a compound contact between the metal layer and the second emitter layer 350 (see, e.g., compound contact 375 of semiconductor device 300 in FIG. 18), and the remaining metal of the metal layer may be removed, and certain processes are the same as or similar to the above-described methods. References can be made to the above descriptions, such as descriptions associated with methods 700 and 800.

FIG. 18 illustrates another example semiconductor device 300. The semiconductor device 300 includes the collector 320 on or over the substrate 310, the base 330 on or over the collector 320, one or more side walls 335 on or over the base 330, and the region 339 on or over the base 330 and surrounded by the side walls 335. The semiconductor device 300 further includes the first emitter layer 340 on or over the base 330, in the region 339, and surrounded by and in contact with the side walls 335, and the second emitter layer 350 on or over the first emitter layer 340, in the region 339, and surrounded by and in contact with the side walls 335, and a compound contact 375 on or over the second emitter layer 350.

The compound contact 375 and the second emitter layer 350 have an interface 355 at a boundary of the compound contact 375 and the second emitter layer 350. Due to different growth rates over semiconductor of the first emitter layer 340 and nitride or oxide of side walls 335, the second surface 352 of the second emitter layer 350 has a curved topography. Accordingly, the interface 355 has a curved topography. With the curved topography of the interface 355, an area of the interface 355 and an area of the compound contact 375 are increased, and accordingly, interface resistance of the interface 355 can be reduced, and the emitter resistance of the device 300 can be reduced.

A second doping concentration of the second emitter layer 350 is higher than a first doping concentration of the first emitter layer 340. The higher second doping concentration of the second emitter layer 350 can reduce the resistance of the interface 355 of the second emitter layer 350 and the compound contact 375. Accordingly, an emitter resistance of the semiconductor device 300 can be reduced. Further, the risk of over running the base 330 by the dopants of the second emitter layer 350 can be reduced, as the first emitter layer 340 with the lower first doping concentration is between the base 330 and the second emitter layer 350. Therefore, risk of an emitter-collector shot can be reduced.

For details of certain structures of the semiconductor device 300 of FIG. 18 and its formation method, references can be made to the above descriptions of semiconductor devices and formation methods, such as descriptions associated with semiconductor devices 100, 200, the methods 700, 800.

In the examples of FIGS. 7, 13, 18, the semiconductor devices can be a bipolar junction transistor device, and an emitter of the bipolar junction transistor device can include a first emitter layer and a second emitter layer having a higher doping concentration than the first emitter layer, a compound contact, and an interface between the compound contact and the second emitter layer. Due to the higher doping concentration of the second emitter layer, resistance of the interface can be reduced.

In other examples, the semiconductor device can be any other suitable semiconductor device (such as a field-effect transistor) that includes a first semiconductor layer and a second semiconductor layer having a higher doping concentration than the first semiconductor layer, and a compound contact in contact with second semiconductor layer. With the second semiconductor layer having a higher doping concentration, an interface between the compound contact and the second semiconductor layer may have a reduced interface resistance. Further, the first semiconductor layer may be between another semiconductor layer of the semiconductor device and the second semiconductor layer and in contact with the first semiconductor layer, and the risk of over running the semiconductor layer in contact with the first semiconductor layer by the dopants of the second semiconductor layer can be reduced due to the first semiconductor layer therebetween.

In the example of FIG. 17, the second surface 352 has a curved topography. In other examples, the vapor deposition for forming the second emitter layer 350 can be performed further or longer, and a valley of the curved topography can be filled faster by the vapor deposition as compared to portions of the curved topography near the side walls 335, and accordingly the second surface 352 of the second emitter layer 350 can become flatter or become flat.

Figure 19:
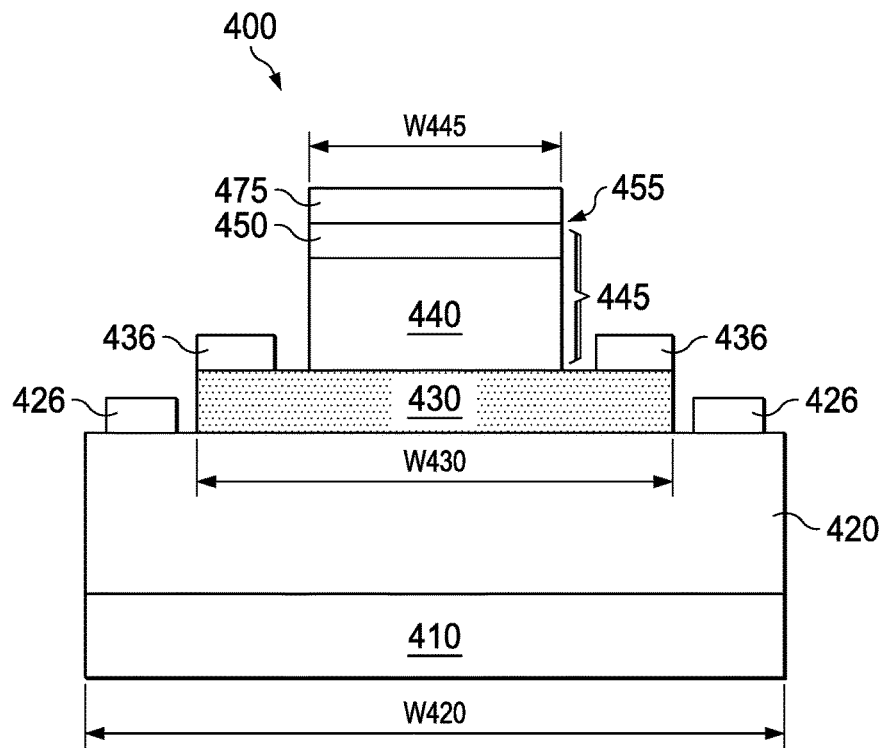
FIG. 19 illustrates another example semiconductor device according to described exam pies.

FIG. 19 illustrates another example semiconductor device 400. The semiconductor device 400 includes a collector 420 on or over a substrate 410, a base 430 on or over the collector 420, a first emitter layer 440 on or over the base 430, a second emitter layer 450 on or over the first emitter layer 440, and a contact 475 (such as a silicide contact) on or over the second emitter layer 450. The contact 475 and the second emitter layer 450 have an interface 455 at a boundary of the contact 475 and the second emitter layer 450. The first emitter layer 440 and the second emitter layer 450 forms an emitter 445 that includes two emitter layers with different doping concentrations. The semiconductor device 400 further includes one or more collector contacts 426 on the collector 420, and one or more base contacts 436 on the base 430.

A second doping concentration of the second emitter layer 450 is higher than a first doping concentration of the first emitter layer 440. The higher second doping concentration of the second emitter layer 450 can reduce the resistance of the interface 455 of the second emitter layer 450 and the contact 475. Accordingly, emitter resistance of the semiconductor device 400 can be reduced. Further, the risk of over running the base 430 by the dopants of the second emitter layer 450 can be reduced, as the first emitter layer 440 with the lower first doping concentration is between the base 430 and the second emitter layer 450. Therefore, risk of an emitter-collector shot in the semiconductor device 400 can be reduced. Certain structures of the semiconductor device 400 is the same as or similar to structures of the above-described semiconductor devices (such as 100, 200). For details of the semiconductor device 400 and its formation method, references can be made to the above descriptions associated with the semiconductor devices, such as 100, 200, and above-described methods.

In the examples of FIG. 19, a width W430 of the base 430 is smaller than a width W420 of the collector 420, and a width W445 of emitter 445 is smaller than the width W430 of the base 430. The base 430 with the width W430 on or over the collector 420 may be formed by etching away a portion of the base 430 with one or more patterned photo-resist masks to obtain a suitable or desired width, or by using one or more patterned photo-resist masks or other suitable materials to cover regions outside the width W430 and depositing respective materials to regions corresponding to the width W430. The emitter 445 with the width W445 on or over the base 430 may be formed by etching away a portion of the emitter 445 with one or more patterned photo-resist masks to obtain a suitable or desired width, or by using one or more patterned photo-resist masks or other suitable materials to cover regions outside the width W445 and depositing respective materials to regions corresponding to the width W445.

In some examples, materials of the base contact 436 include at least one of Si or Ge doped with B (boron), forming a silicide with Co, Ni or the like, and materials of the collector contact 426 include at least one of Si or Ge doped with As, Sb or P, forming a silicide with Co, Ni or the like.

Figure 20:
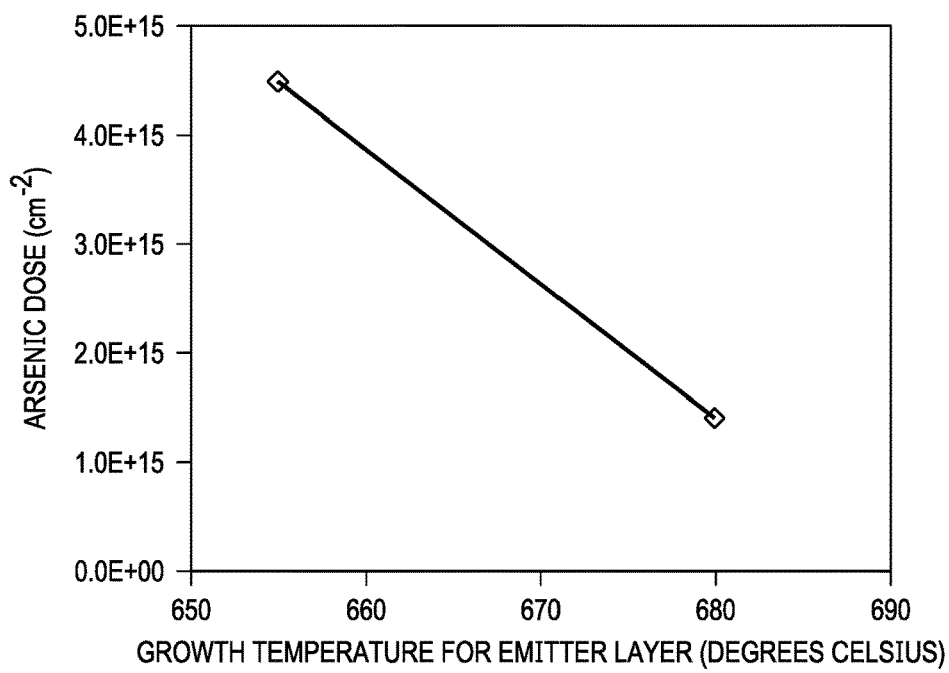
FIG. 20 illustrates an example relationship between dopant doses and growth temperatures of an emitter layer.

FIG. 20 illustrates an example relationship between dopant doses and growth temperatures of an emitter layer. In the example of FIG. 20, arsenic is dopant for polysilicon. Arsenic doses in polysilicon are increased as the growth temperature for the emitter layer are decreased. Arsenic doses are equal to arsenic concentrations multiplied by the thickness of the emitter layer. Accordingly, arsenic concentrations in polysilicon are increased as the growth temperature for the emitter layer (e.g., the second emitter layer 150, 250, 350) are decreased. Dopant concentrations or doping concentrations of the second emitter layer (e.g., 150, 250, 350, 450) can be increased by reducing growth temperatures of the second emitter layer.

Figure 21:
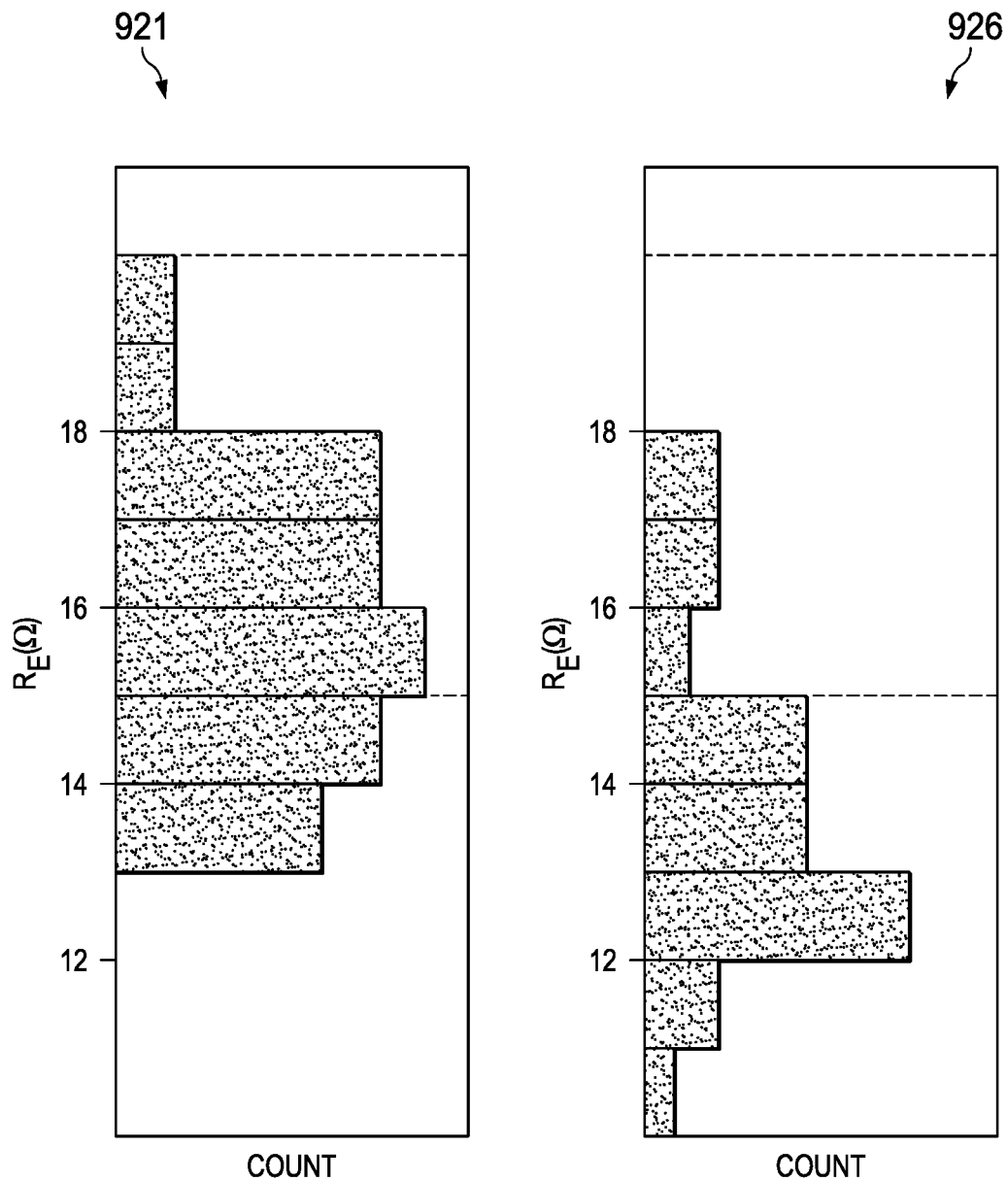
FIG. 21 shows reduced emitter resistance in example devices with two emitter layers as compared to devices without two emitter layers.

FIG. 21 shows reduced emitter resistance in example devices with two emitter layers as compared to devices without two emitter layers. Histogram 921 corresponds to bipolar junction transistors without two emitter layers (i.e., with only one emitter layer), while histogram 926 corresponds to bipolar junction transistors with two emitter layers. Vertical axes of histogram 921 and 922 show values of emitter resistance (i.e., $R_E$). Emitter resistance in histogram 926 is shifted to lower values, as compared to histogram 921. Accordingly, bipolar junction transistors with two emitter layers consistent with the present disclosure have reduced emitter resistance.

Figure 22:
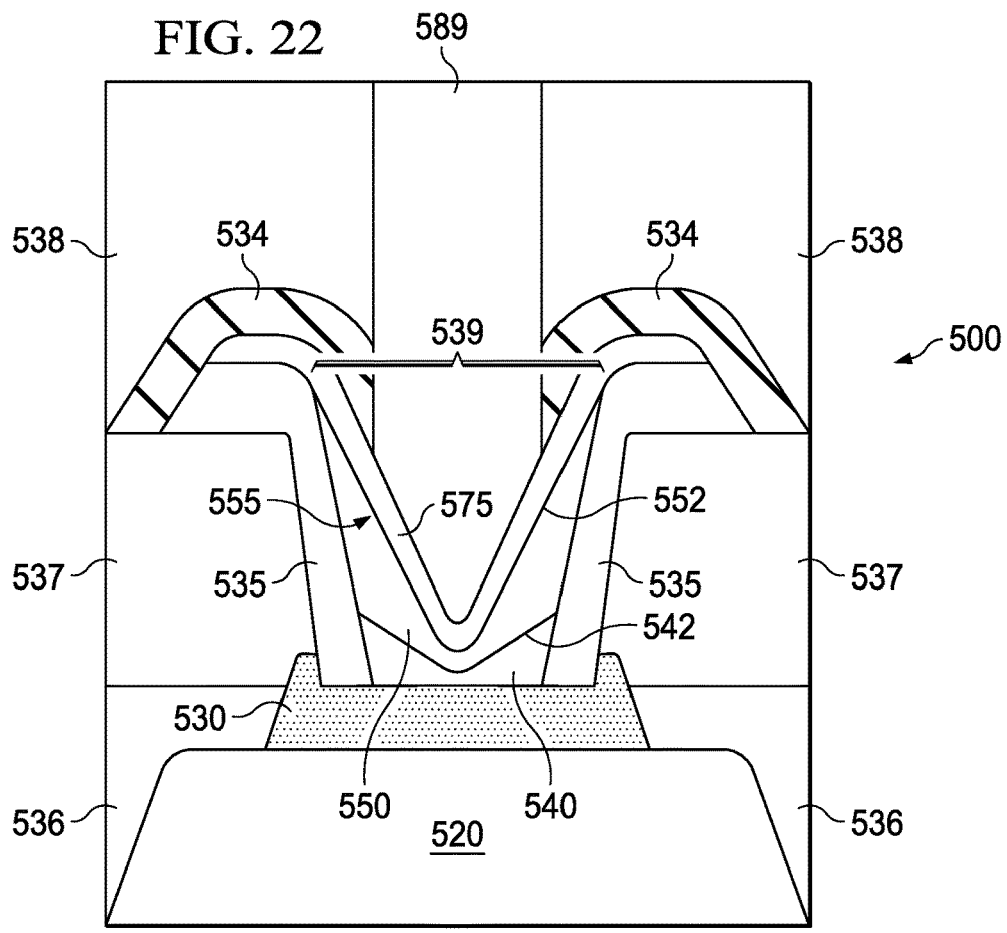
FIG. 22 illustrates another example semiconductor device.

FIG. 22 illustrates another example semiconductor device 500. The semiconductor device 500 includes a Si collector 520, a base 530 on or over the collector 520, one or more side walls 535 (such as silicon nitride or oxide side walls) on or over the base 530 with a region 539 on or over the base 530 and surrounded by the side walls 535. In some examples, the base 530 includes Si, SiGe, a combination of Si and SiGe, or any other suitable semiconductor. The semiconductor device 500 further includes a first Si emitter layer 540 on or over the base 530, in the region 539, and surrounded by and in contact with the side walls 535, and a second emitter layer 550 on or over the first emitter layer 540, in the region 539, and surrounded by and in contact with the side walls 535, and a compound contact 575 on or over the second emitter layer 550, and a tungsten contact 589 on or over the compound contact 575. The compound contact 575 can include silicide formed by metal and silicon. The compound contact 575 and the second emitter layer 550 have an interface 555 at a boundary of the compound contact 575 and the second emitter layer 550. Due to different growth rates over semiconductor of the first emitter layer 540 and side walls 535, a second surface 552 of the second emitter layer 550 has a curved topography. Accordingly, the interface 555 has a curved topography. The curved topography of the second surface 552 of the second emitter layer 550 and of the interface 555 has a height larger than a width to form a folded topography or folded structure. A second doping concentration of the second emitter layer 550 is higher than a first doping concentration of the first emitter layer 540. Further, the semiconductor device 500 can include oxide layers (such as 536, 538), silicon nitride layers (such as 534) and/or silicon layers (such as 520, 537).

For forming the semiconductor device 500, a collector 520 may be formed on or over a substrate by deposition. An oxide layer 536 can be formed on or over the collector 520 by deposition or thermal oxidation, and an extrinsic base region 537 can be deposited over oxide layer 536, and a hole can be etched in the extrinsic base 537 and the oxide layer 536 as a cavity in which intrinsic base 530 may be formed on or over the collector 520 by deposition. One or more oxide or nitride side walls 535 may be formed on or over the base 530 by vapor deposition, which spatially isolate the first emitter layer 540 and the second emitter layer 550 from the extrinsic base 537. For example, the first emitter layer 540 is in contact with the intrinsic base 530, but not in contact with the extrinsic base 537, as the first emitter layer 540 is spatially separated from the extrinsic base 537 by the side walls 535. The side walls 535 may be formed by depositing oxide or nitride and etching back.

The first emitter layer 540 may be formed on or over the base 530 and in the region 539 by vapor deposition. The second emitter layer 550 may be formed on or over the first emitter layer 540 by vapor deposition. For different growth rates over semiconductor of the base 530 and nitride of side walls 535, the second surface 542 of the first emitter layer 540 and the second surface 552 of the second emitter layer 550 each may have a curved topography (e.g., a folded topography). Further, a metal layer may be deposited on or over the second emitter layer 550, and a heat treatment may be performed to convert a portion (such as a second portion in contact with the metal layer) of the second emitter layer 550 into the compound contact 575 between the metal layer and the second emitter layer 550. Further, the metal layer may be converted by silicidation (e.g., to be a portion of the compound contact 575) and the tungsten contact 589 may be formed on or over the compound contact 575 by deposition. Layer 534 is a dielectric film used to hermetically seal the device, and dielectric layer 538 separates higher metal layers from the device.

For details of certain structures of the semiconductor device 500 of FIG. 22 and its formation method, references can be made to the above descriptions of semiconductor devices and formation methods, such as descriptions associated with semiconductor devices 100, 200, 300, the methods 700, 800 and method for forming device 300.

Figure 23:
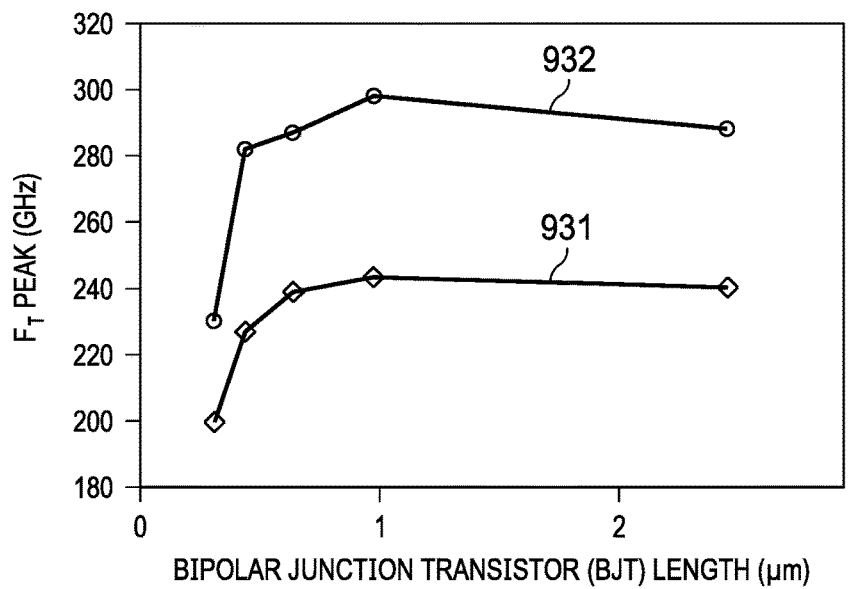
FIG. 23 shows increased cut-off frequency ($f_T$) in an example bipolar junction transistor (BJT) device with two emitter layers as compared to a BJT device without two emitter layers.

FIG. 23 shows increased cut-off frequency ($f_T$) in an example BJT device with two emitter layers as compared to a BJT device without two emitter layers. Curve 932 shows the cut-off frequency ($f_T$) peak of the example BJT device with two emitter layers at various bipolar junction transistor (BJT) lengths. Curve 931 shows the cut-off frequency ($f_T$) peak of the BJT device without two emitter layers (i.e., with only one emitter layer) at various bipolar junction transistor (BJT) lengths. The cut-off frequency ($f_T$) of the example BJT device with two emitter layers is increased as compared to the cut-off frequency ($f_T$) of the BJT device without two emitter layers. Relative to FIG. 22, BJT length here refers to the thickness of the component into the page. The emitter resistance is to first order inversely dependent of the device length but is multiplied by factors such as collector current and capacitance which are linearly dependent on device length, making the sum length invariant. This graph validates the improvement in emitter resistance.

Various shapes and dimensions can be chosen for layers or structures (e.g., 110, 120, 130, 140, 150, 155, 175) of the semiconductor device (e.g., 100 of FIG. 7) according to application scenarios, by, e.g., deposition and etching with one or more patterned photo-resist masks, or by any other suitable processes. For example, along a direction parallel to the first surface 141 of the first emitter layer 140, a width of the first emitter layer 140 may be reduced, such that the width of the first emitter layer 140 may be shorter than a width of the base 130.

The semiconductor device consistent with present disclosure can include other components and layers. For example, the semiconductor device (such as 100, 200, 300) can further include a collector contact on a respective collector (such as 120, 220, 320), and a base contact on a respective base (such as 130, 230, 330). The collector contact may be formed by exposing a portion of respective collector (e.g., by etching), and depositing contact materials thereon. The base contact may be formed by exposing a portion of respective base (e.g., by etching), and depositing contact materials thereon.

In the present disclosure, the first emitter layer (e.g., 140) and the second emitter layer (e.g., 150) are deposited or formed in two or multiple steps (such as 803, 804), respectively. The two-step (or multiple-step) deposition or formation allows the second emitter layer to be doped at a higher doping concentration than the first emitter layer.

Modifications, additions, or omissions may be made to the systems, devices, and methods described herein without departing from the scope of the disclosure. Moreover, the operations of the systems and devices disclosed herein may be performed by including more, fewer, or other components; and the methods described may include more, fewer, or other steps. Additionally, steps may be performed in any suitable order.

Modifications are possible in the described embodiments, and other embodiments are possible, within the scope of the claims.

What is claimed is:

1. A method of forming a semiconductor device, the method comprising:
   forming a first semiconductor layer with a first doping concentration of a first doping type;
   forming a second semiconductor layer directly on the first semiconductor layer, the second semiconductor layer with a second doping concentration of the first doping type, wherein the second doping concentration is greater than the first doping concentration, and wherein:
   the first semiconductor layer is formed at a first growth temperature; and
   the second semiconductor layer is formed at a second growth temperature less than the first growth temperature;
   forming a metal layer on the second semiconductor layer; and
   forming a contact between the second semiconductor layer and the metal layer by applying a heat treatment.

2. The method of claim 1, wherein:
   the first semiconductor layer is formed by vapor deposition at a first dopant flow rate; and
   the second semiconductor layer is formed by vapor deposition at a second dopant flow rate.

3. The method of claim 2, wherein the second dopant flow rate is greater than the first dopant flow rate.

4. The method of claim 2, wherein the second dopant flow rate is same as the first dopant flow rate.

5. The method of claim 1, wherein forming the second semiconductor layer includes depositing silicon with a dopant and at least one of germanium or carbon.

6. The method of claim 1, further comprising:
   forming a third semiconductor layer between the second semiconductor layer and the metal layer and with a third doping concentration lower than the second doping concentration;
   wherein forming the contact between the second semiconductor layer and the metal layer includes:
   converting the third semiconductor layer and a portion of the second semiconductor layer into the contact by applying the heat treatment.

7. The method of claim 1, wherein:
   the first semiconductor layer is a first emitter layer; and
   the second semiconductor layer is a second emitter layer;
   the method further comprising:
   forming a collector layer of the first doping type; and
   forming a base layer of a second doping type and between the collector layer and the first semiconductor layer, wherein the base layer is in contact with the first semiconductor layer.

8. The method of claim 7, wherein:
   the first doping type is n-type, and the second doping type is p-type.

9. The method of claim 7, wherein:
   the first doping type is p-type, and the second doping type is n-type.

10. The method of claim 7, wherein:
    the second emitter layer includes at least one of germanium or carbon.

11. The method of claim 1, wherein the second semiconductor layer includes a dopant activation ratio less than the first semiconductor layer.

12. The method of claim 7, wherein the base layer includes SiGe.

13. The method of claim 7, wherein the first doping concentration of the first emitter layer is less than a doping concentration of the second doping type of the base layer.

14. The method of claim 8, wherein the first and second emitter layers each includes silicon doped with at least one of arsenic or phosphorus.

15. The method of claim 9, wherein the first and second emitter layers each includes silicon doped with at least one of boron or indium.

16. A method, comprising:
    forming a collector layer on a substrate, wherein the collector layer includes a silicon layer of a first doping type;
    forming a base layer on the collector layer, wherein the base layer includes a silicon layer of a second doping type opposite the first doping type;
    forming a first emitter layer on the base layer, wherein the first emitter layer includes a silicon layer having a first doping concentration of the first doping type;
    forming a second emitter layer on the first emitter layer, wherein the second emitter layer includes a silicon layer having a second doping concentration of the first doping type greater than the first doping concentration, and wherein;
    the first emitter layer is formed by vapor deposition at a first dopant flow rate; and
    the second emitter layer is formed by vapor deposition at a second dopant flow rate; and
    forming a metal layer on the second emitter layer to form an electrical contact on the second emitter layer.

17. The method of claim 16, wherein:
    the first emitter layer is formed at a first growth temperature; and
    the second emitter layer is formed at a second growth temperature less than the first growth temperature.

18. The method of claim 16, wherein the second dopant flow rate is greater than the first dopant flow rate.

19. The method of claim 16, wherein the second dopant flow rate is same as the first dopant flow rate.

20. The method of claim 16, wherein the second emitter layer includes a dopant activation ratio less than the first emitter layer.

21. The method of claim 16, wherein the base layer includes SiGe.

22. The method of claim 16, wherein the first doping concentration of the first emitter layer is less than a doping concentration of the second doping type of the base layer.

23. The method of claim 16, further comprising:
    applying a heat treatment to the substrate after forming the metal layer, wherein the electrical contact includes a silicide with metal from the metal layer as a result of applying the heat treatment.

24. The method of claim 16, wherein the second emitter layer includes at least one of germanium or carbon.

* * * * *